(12) United States Patent
Takahashi

(10) Patent No.: US 6,198,978 B1
(45) Date of Patent: Mar. 6, 2001

(54) SEMICONDUCTOR INTEGRATED CIRCUIT DESIGNING SYSTEM TAKING INSERTION OF REPEATERS INTO CONSIDERATION AND DESIGNING METHOD THEREOF

(75) Inventor: Shuji Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/129,538

(22) Filed: Aug. 5, 1998

(30) Foreign Application Priority Data

Aug. 8, 1997 (JP) .................................. 9-215070

(51) Int. Cl.⁷ .................................. G06F 19/00
(52) U.S. Cl. ................ 700/97; 700/98; 700/117; 700/121; 716/1; 716/5; 716/9; 716/19
(58) Field of Search .................... 716/1, 5, 6, 9–10, 716/19; 700/97, 98, 117, 121

(56) References Cited

U.S. PATENT DOCUMENTS

| | | | |
|---|---|---|---|
| 5,859,776 | * | 1/1999 | Sato et al. .................. 700/97 |
| 5,974,245 | * | 10/1999 | Li et al. ..................... 710/13 |
| 5,978,572 | * | 11/1999 | Toyonaga et al. ............. 716/5 |
| 5,995,735 | * | 11/1999 | Le ........................... 716/13 |
| 6,051,031 | * | 4/2000 | Shubat et al. ................ 716/3 |
| 6,058,257 | * | 5/2000 | Nojima ...................... 716/5 |

FOREIGN PATENT DOCUMENTS 4251961   9/1992   (JP) .

* cited by examiner

Primary Examiner—William Grant
Assistant Examiner—Ramesh Patel
(74) Attorney, Agent, or Firm—Sughrue, Mion, Zinn, Macpeak & Seas, PLLC

(57) ABSTRACT

A semiconductor integrated circuit designing system comprises an input unit for receiving input of parameters regarding circuit blocks constituting an LSI, a repeater information calculation unit for obtaining information regarding repeater insertion by using applied parameters, a circuit block arrangement unit for arranging circuit blocks based on information regarding repeater insertion, a delay calculation unit for calculating a wire delay of wiring between arranged circuit blocks, a cycle time calculation unit for obtaining a cycle time of the entire LSI based on a calculated delay value, and a detailed wiring unit for conducting detailed wiring within a circuit block on an LSI whose arrangement on a circuit block basis and wiring processing have been completed.

13 Claims, 5 Drawing Sheets

SEMICONDUCTOR INTEGRATED CIRCUIT DESIGNING SYSTEM TAKING INSERTION OF REPEATERS INTO CONSIDERATION AND DESIGNING METHOD THEREOF

BACKGROUND OF THE INVENTION

1. Field of the Invention

The present invention relates to a semiconductor integrated circuit designing method and, more particularly, to a semiconductor integrated circuit designing system which efficiently conducts arrangement and wiring of circuit blocks into which repeaters as a means of reducing a wire delay are inserted and a designing method thereof.

2. Description of the Related Art

Design for a semiconductor integrated circuit (LSI) costs much time for the work of changing arrangement of circuit blocks in order to reduce a wire delay. As LSIs are made larger in scale to make wiring more complicated, there happens more often everywhere on an LSI chip a case where change of arrangement of circuit blocks for the purpose of shortening a predetermined wire results in adversely having other wires elongated. As a result, enormous time will be required before optimum arrangement and wiring of circuit blocks are determined. Then, the longer the time required for designing an LSI is, the more the LSI costs.

Under these circumstances, means for solving the above-described problem has been conventionally proposed. One of the conventional techniques of this kind is disclosed, for example, in Japanese Patent Laying-Open (Kokai) No. Heisei 4-251961, entitled "System for Designing Circuit Block Arrangement by CAD", which is a system including a theoretical delay calculation unit for calculating a logical delay value of a target circuit based on logic connection information and circuit rules, a critical path decision unit for deciding on a critical path by the comparison between a logical delay value and predetermined constraint conditions of the target circuit, and a block arrangement unit for arranging a circuit block constituting a critical path so as to have a wire delay not more than a limiting value indicated in the circuit constraint conditions, as well as arranging a circuit block not constituting the critical path so as to make wiring easy, thereby deciding a critical path, with arrangement of circuit blocks changed so as to have as few long wires as possible.

The technique recited in the above literature, however, fails to take into consideration a method of inserting a repeater which is a common method for reducing a wire delay.

While insertion of a repeater into a long wire enables reduction of a delay caused by wire, it should ensure an area for arranging repeaters on an LSI chip. With repeaters included, therefore, layout of elements and wires should be further modified, which results in increase in an LSI designing time period.

Moreover, as reduction in scale of elements constituting an LSI and miniaturization of wires have been accelerated recently, a wire resistance and a wire capacitance are increased to make a wire length shorter into which repeaters are necessary to be inserted and a space between repeaters narrower, whereby the number of repeaters to be inserted tends to be sharply increased. This makes work for modifying layout of elements and wires more complicated to further increase an LSI designing time period.

SUMMARY OF THE INVENTION

An object of the present invention is to provide an efficient semiconductor integrated circuit designing system which eliminates the above-described conventional shortcomings and enables reduction in time required for designing, as well as allowing drastic design change for the insertion of repeaters after detailed design to be avoided by obtaining, in LSI design, guidelines for repeater insertion prior to decision of detailed wiring, and a designing method thereof.

According to the first aspect of the invention, a semiconductor integrated circuit designing system which designs an LSI by arranging circuit blocks on an LSI chip and conducting wiring within the circuit blocks and between the circuit blocks, comprises input means for receiving input of a technology parameter, a circuit parameter and a clock parameter regarding the circuit blocks constituting the LSI, repeater information calculation means for obtaining information regarding insertion of repeaters by using the parameters applied through the input means, circuit block arrangement means for arranging the circuit blocks based on the information regarding insertion of repeaters obtained by the repeater information calculation means, delay calculation means for calculating a wire delay of wiring between the circuit blocks arranged by the circuit block arrangement means, cycle time calculation means for obtaining a cycle time of the entire LSI based on a delay value calculated by the delay calculation means, and detailed wiring means for conducting detailed wiring within the circuit blocks on the LSI whose arrangement on a circuit block basis and wiring processing have been completed.

In the preferred construction, the repeater information calculation means predicts, as information regarding insertion of repeaters, at least a size and a wire length of a circuit block which will require repeater insertion.

In another preferred construction, the repeater information calculation means predicts, as information regarding insertion of repeaters, at least a size and a wire length of a circuit block which will require repeater insertion, and a minimum necessary number of stages of repeaters inserted and a minimum necessary ratio of a gate width to a gate length of a repeater with respect to a wire which requires repeater insertion.

In another preferred construction, the repeater information calculation means predicts, as information regarding insertion of repeaters, at least a block size of the circuit block where repeaters having a minimum necessary number of insertion stages and a minimum necessary ratio of a gate width to a gate length would be inserted into every wire which will require repeater insertion by using a wire distribution predicted from the parameters.

In another preferred construction, the repeater information calculation means predicts, as information regarding insertion of repeaters, at least a size and a wire length of a circuit block which will require repeater insertion, a minimum necessary number of stages of repeaters inserted and a minimum necessary ratio of a gate width to a gate length of a repeater with respect to a wire which requires repeater insertion, and a block size of the circuit block where repeaters having a minimum necessary number of insertion stages and a minimum necessary ratio of a gate width to a gate length would be inserted into every wire which will require repeater insertion by using a wire distribution predicted from the parameters.

In another preferred construction, the repeater information calculation means predicts, as information regarding insertion of repeaters, at least a size and a wire length of a circuit block which will require repeater insertion, and the circuit block arrangement means limits a size of each circuit block to a size which will require no repeater insertion to arrange the circuit block.

In another preferred construction, the repeater information calculation means predicts, as information regarding insertion of repeaters, at least a size and a wire length of a circuit block which will require repeater insertion, and a minimum necessary number of stages of repeaters inserted and a minimum necessary ratio of a gate width to a gate length of a repeater with respect to a wire which requires repeater insertion, and the circuit block arrangement means estimates an area necessary for the arrangement of the circuit blocks and wiring between the circuit blocks and prepares a region for wiring among the circuit blocks according to an obtained value to arrange the circuit blocks.

According to the second aspect of the invention, a semiconductor integrated circuit designing method of designing an LSI by arranging circuit blocks on an LSI chip and conducting wiring within the circuit blocks and between the circuit blocks, comprising the steps of receiving input of a technology parameter, a circuit parameter and a clock parameter regarding the circuit blocks constituting the LSI, obtaining information regarding insertion of repeaters by using the parameters applied, arranging the circuit blocks based on the information regarding insertion of repeaters, calculating a wire delay of wiring between the circuit blocks arranged, obtaining a cycle time of the entire LSI based on a calculated delay value, and conducting detailed wiring within the circuit blocks on the LSI whose arrangement on a circuit block basis and wiring processing have been completed.

In the preferred construction, at the repeater information calculation step, at least a size and a wire length of a circuit block which will require repeater insertion are predicted as information regarding insertion of repeaters, and at the circuit block arrangement step, a size of each circuit block is limited to a size which will require no repeater insertion to arrange the circuit block.

In another preferred construction, at the repeater information calculation step, predicted as information regarding insertion of repeaters are at least a size and a wire length of a circuit block which will require repeater insertion, and a minimum necessary number of stages of repeaters inserted and a minimum necessary ratio of a gate width to a gate length of a repeater with respect to a wire which requires repeater insertion, and at the circuit block arrangement step, an area necessary for the arrangement of the circuit blocks and wiring among the circuit blocks is estimated and a region for wiring among the circuit blocks is prepared according to the obtained value to arrange the circuit blocks.

According to another aspect of the invention, a computer readable memory storing a computer program for controlling a semiconductor integrated circuit designing system which designs an LSI by arranging circuit blocks on an LSI chip and conducting wiring within the circuit blocks and between the circuit blocks, the computer program comprising the steps of receiving input of a technology parameter, a circuit parameter and a clock parameter regarding the circuit blocks constituting the LSI, obtaining information regarding insertion of repeaters by using the parameters applied, arranging the circuit blocks based on the information regarding insertion of repeaters, calculating a wire delay of wiring between the circuit blocks arranged, obtaining a cycle time of the entire LSI based on a calculated delay value, and conducting detailed wiring within the circuit blocks on the LSI whose arrangement on a circuit block basis and wiring processing have been completed.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

Figure 1:
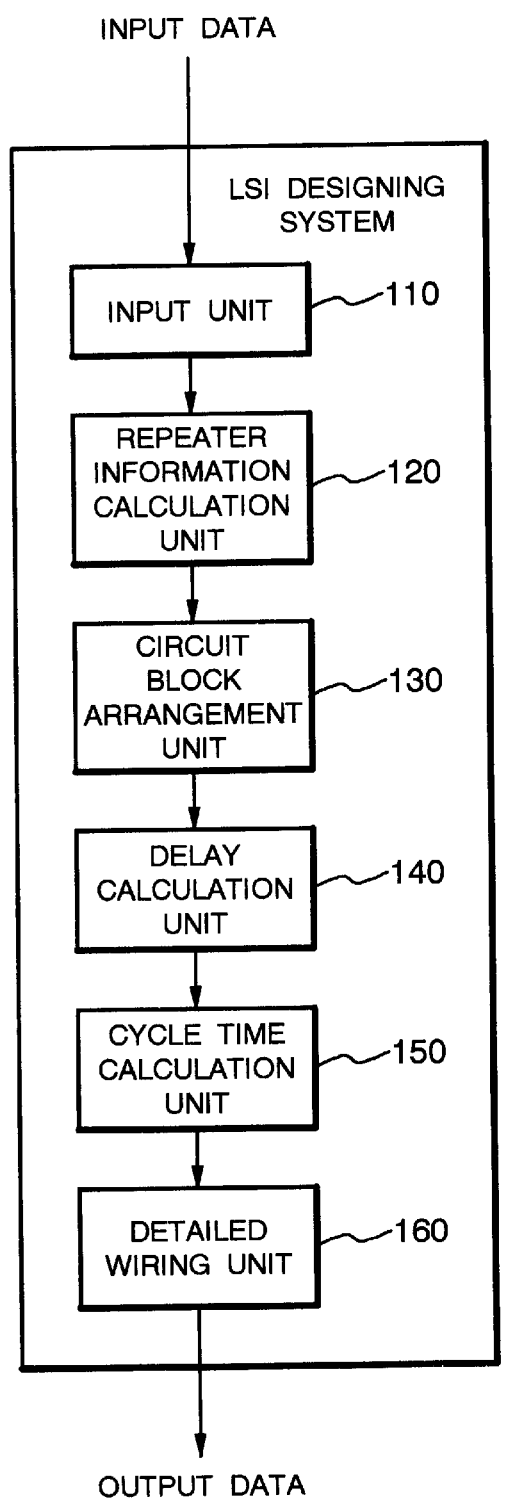
FIG. 1 is a block diagram showing structure of an LSI designing system according to one embodiment of the present invention.

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

First, an LSI designing method according to the present invention will be outlined. In the present invention, first divide an LSI to be designed into several circuit blocks. Next, with respect to each circuit block, predict various data regarding a repeater such as size and a wire length of a circuit block which will require repeater insertion, a minimum necessary number of repeater insertion stages and a minimum necessary ratio of a gate length to a gate width of a repeater, and a size of a circuit block into which repeaters will have been inserted based on a technology parameter, a circuit parameter and a clock parameter. Then, using an estimated value of each circuit block size, arrange circuit blocks. At this occasion, estimate an area necessary for providing a region dedicated for the formation of wires between the respective blocks and arrange the circuit blocks at a distance according to the estimated value from each other. Thereafter, make layout of detailed wiring in each circuit block. As described in the foregoing, rough arrangement of each circuit block taking the effects of repeater insertion into consideration prior to layout of detailed wiring in each circuit block allows drastic design change to be avoided which will be necessary at the insertion of repeaters after detailed design.

Next, the above-described LSI designing method will be described using mathematical expressions. First, set the following 31 input parameters for each circuit block. Among the parameters, there exist a plurality of parameters whose values are common to each circuit block such as a gate length and a supply voltage.

[technology parameter]
$L_g$: gate length
$V_{DD}$: supply voltage
$V_{TH}$: threshold voltage
$t_{gox}$: gate oxide film thickness
$R_{int\ lc}$: wire resistance per unit wire length in local wiring
$C_{int\ lc}$: wire capacitance per unit wire length in local wiring
$R_{int\ gl}$: wire resistance per unit wire length in global wiring
$C_{int\ gl}$: wire capacitance per unit wire length in global wiring
$\epsilon'$: dielectric constant of interlayer film
$n_{w\ lc}$: the number of wiring layers in local wiring
$n_{w\ gl}$: the number of wiring layers in global wiring
$p_{w\ lc}$: wire pitch of local wiring
$p_{w\ gl}$: wire pitch of global wiring
$e_w$: wiring efficiency
$R_0$: resistance of minimum-sized nMOS transistor
[circuit parameter]
$f_{ld}$: the number of stages of logic
$f_g$: mean gate fan out
$h_{lgc}$: average ratio of gate width to gate length of nMOS transistor in logic circuit unit
$h_{rp}$: ratio of gate width to gate length of nMOS transistor at repeater to be inserted into global wiring
$p_{rp}$: space between repeaters to be inserted in global wiring
$p$: Rent's exponent
$k$: wire distribution proportional coefficient
$L_{rp}$: minimum wire length requiring repeater insertion
$r_{gl}$: ratio of longest global wiring to circuit block size
$N_{g\ tgt}$: a target number of gates
$D_{C\ tgt}$: target circuit block size
$D_x$: size of circuit block requiring repeater insertion
$D_{crp}$: size of circuit block into which repeaters will have been inserted $T_{C\ tgt}$: target cycle time
$f_{C\ tgt}$: target operating frequency
[clock parameter]
$T_{skew}$: clock skew of circuit block Using these parameters, first calculate a cycle time of an LSI and plot the cycle time in a graph as a function with respect to a circuit block size. For the calculation of an LSI cycle time, a common method can be employed. Although in the above list, the technology parameters and the circuit parameters as the input parameters are listed those for local wiring and those for global wiring, predictive calculation of a cycle time is made disregarding the parameters regarding global wiring. Assuming a predicted value $T_C$ of a cycle time to be a function with a circuit block size $D_C$ as a variable, the predicted value $T_C$ of a cycle time can be expressed as the following equation (1).

$$T_C=T_C(D_C) \tag{1}$$

Next, calculate a delay value $T_g$. Although a calculation expression will change depending on a kind of a delay model used, calculation is made assuming that a delay is in general expressed by the following equation (2).

$$T_g=a \cdot R_{gout}C_{int}l+b \cdot R_{gout}C_{gin}+c \cdot R_{int}C_{int}l^2+d \cdot R_{int}C_{gin} \tag{2}$$

In the equation (2), $R_{gout}$ denotes an output resistance of a gate and $C_{gin}$ denotes an input capacitance of a gate. Here, a delay $T_{d\ gl}$ on a wire with a length of $L_{int\ gl}$ will be calculated according to the following equation (3), with a delay of a transistor disregarded.

$$T_{d\ gl}=c \cdot R_{int\ gl}C_{int\ gl}L_{int\ gl}^2 + tm \tag{3}$$

Since what suppresses performance of a chip is a long wire such as global wiring, letters _gl indicative of global wiring are represented as subscripts in the equation (3). Disregarding a delay of a transistor is aimed at obtaining a minimum value of a delay. In other words, even with the drivability of a transistor enhanced to the maximum, delay will not be less than a delay value obtained by the equation (3).

Next, plot a wire delay $T_{d\ gl}(L_{int})$ in global wiring having a wire length of $L_{int}$ and a cycle time $T_C(D_C)$ for a circuit block size $D_C$ in the same graph to compare. At this occasion, using a ratio $r_{gl}$ of the longest global wiring to a circuit block size, express $L_{int\ gl}$ of the equation (3) as follows:

$$L_{int\ gl}=r_{gl} \cdot D_C \tag{3a}$$

and rewrite the equation (3) as a function with respect to a block size such as shown by the following equation (3b) to compare the wire delay and the cycle time on the same graph.

$$T_{d\ gl}(D_C)=c \cdot R_{int\ gl}C_{int\ gl}r_{gl}^2D_C^2 \tag{3b}$$

The comparison shows that while a circuit block size $D_C$ is small, $T_{d\ gl}(D_C)$ is small and $T_C(D_C)$ is dominant over the performance of a chip and that as the circuit block size $D_C$ is increased, $T_{d\ gl}(D_C)$ is sharply increased in a manner of quadratic function to exceed $T_C(D_C)$ in due course.

Next, based on the foregoing calculation results, calculate a minimum value $L_{rp}$ of a wire length which requires repeater insertion. First, determine a target circuit block size $D_{C\ tgt}$ based on a target number of gates $N_{tgt}$ of a circuit block and determine a target cycle time $T_{c\ tgt}$ using the graph of a predicted cycle time value $T_C(D_C)$. Calculation of a circuit block size $D_{C\ tgt}$ can be made by a common method. Next, extend the ends of the obtained $T=T_{C\ tgt}$ rightward and leftward to obtain a point of intersection with the graph of $T_{d\ gt}(D_C)$. Regarding a value of the point of intersection corresponding to the x-axis as Dx, a minimum value $L_{rp}$ of a wire length requiring repeater insertion can be obtained according to the following equation (3c).

$$L_{rp} = r_{gt} D_x \qquad (3c)$$

Next, calculate a minimum necessary number $n_{rp}$ of stages of repeaters inserted and a minimum necessary ratio $h_{rp}$ of a gate length to a gate width of a repeater. With respect to a wire with a wire length l, when $1 \leq Lrp$, insertion of a repeater is unnecessary and only when $l > L_{rp}$ holds, calculation is to be made. When $l > L_{rp}$ holds, the number $n_{rp}$ of stages of repeaters inserted and a ratio $h_{rp}$ of a gate length to a gate width are calculated in a manner as described in the following.

Condition 1: in a case where (4a) shown below holds
If $$T_{C\ tgt} \geq 2(\sqrt{ad}+\sqrt{bc})\sqrt{R_0 C_0 R_{int} C_{int}} \cdot l$$

and when there exists a natural number from $$\frac{\left( T_{Ctgt} - 2\sqrt{adR_0 C_0 R_{int} C_{int}} \cdot l - \sqrt{\left(T_{Ctgt} - 2\sqrt{adR_0 C_0 R_{int} C_{int}} \cdot l\right)^2 - 4bcR_0 C_0 R_{int} C_{int} \cdot l^2} \right)}{(2bR_0 C_0)}$$

to $$\frac{T_{Ctgt} - 2\sqrt{adR_0 C_0 R_{int} C_{int}} \cdot l + \sqrt{\left(T_{Ctgt} - 2\sqrt{adR_0 C_0 R_{int} C_{int}} \cdot l\right)^2 - 4bcR_0 C_0 R_{int} C_{int} \cdot l^2}}{2bR_0 C_0} \qquad (4a)$$

then, $n_{rp}$ and $h_{rp}$ are given by the following expressions:

$$n_{rp} = \frac{T_{Ctgt} - 2\sqrt{adR_0 C_0 R_{int} C_{int}} \cdot l - \sqrt{\left(T_{Ctgt} - 2\sqrt{adR_0 C_0 R_{int} C_{int}} \cdot l\right)^2 - 4bcR_0 C_0 R_{int} C_{int} \cdot l^2}}{2bR_0 C_0} \qquad (5)$$

$$h_{rp} = \frac{T_{Ctgt} - bn_{rp} R_0 C_0 - c\frac{R_{int} C_{int} \cdot l^2}{n_{rp}} - \sqrt{\left(T_{Ctgt} - bn_{rp} R_0 C_0 - c\frac{R_{int} C_{int} \cdot l^2}{n_{rp}}\right)^2 - 4adR_0 C_0 R_{int} C_{int} \cdot l^2}}{2dR_{int} l C_0} \qquad (6)$$

In the above expression (5), numbers below the decimal point are raised.

Condition 2: in a case where the expression (4b) or (7) shown below holds
If $$T_{C\ tgt} \geq 2(\sqrt{ad}+\sqrt{bc})\sqrt{R_0 C_0 R_{int} C_{int}} \cdot l$$

and when there exists no natural number from $$\frac{\left( T_{Ctgt} - 2\sqrt{adR_0 C_0 R_{int} C_{int}} \cdot l - \sqrt{\left(T_{Ctgt} - 2\sqrt{adR_0 C_0 R_{int} C_{int}} \cdot l\right)^2 - 4bcR_0 C_0 R_{int} C_{int} \cdot l^2} \right)}{(2bR_0 C_0)}$$

to $$\frac{T_{Ctgt} - 2\sqrt{adR_0 C_0 R_{int} C_{int}} \cdot l + \sqrt{\left(T_{Ctgt} - 2\sqrt{adR_0 C_0 R_{int} C_{int}} \cdot l\right)^2 - 4bcR_0 C_0 R_{int} C_{int} \cdot l^2}}{2bR_0 C_0} \qquad (4b)$$

or if $$T_{C\ tgt} < 2(\sqrt{ad}+\sqrt{bc})\sqrt{R_0 C_0 R_{int} C_{int}} \cdot l \qquad (7)$$

then, $n_{rp}$ and $h_{rp}$ are given by the following expressions:

$$n_{rp} = \sqrt{\frac{cR_{int} C_{int}}{bR_0 C_0}} \cdot l \qquad (8)$$

$$h_{rp} = \sqrt{\frac{aR_0 C_{int}}{dR_{int} C_0}} \qquad (9)$$

In the expression (8), numbers below the decimal point are raised. In a case of Condition 2, a target value of a cycle time determined first can not be attained. The reason is that even when repeaters are inserted so as to have a minimum delay, the delay value can not be less than $T_{C\ tgt}$. Under these conditions, delay in global wiring will suppress an operating frequency of an LSI. The expressions (8) and (9) are equations resulting from the conditions under which a delay is minimum.

Lastly, using a theoretical expression of wire distribution, count the number of repeaters inserted with respect to all the wires whose length l is larger than $L_{rp}$ according to the expressions (5) and (8) and further calculate the number of increased gates from an expansion rate of a ratio $h_{rp}$ of a gate length to a gate width of a repeater to a ratio $h_{lgc}$ of a gate width to a gate length of a repeater, whereby size of a circuit block into which repeaters will have been inserted can be estimated. Expressing the number of repeaters to be inserted as $N_{rp}$, the increase $\Delta N_g$ in terms of the number of gates can be calculated by the following expression (10).

$$\Delta N_g = \frac{N_{rp} h_{rp}}{2 f_g h_{lgc}} \qquad (10)$$

Accordingly, size of a circuit block into which repeaters will have been inserted can be obtained by making a calculation over again assuming that the target number of gates is newly expressed as the following equation.

$$N_g' = N_g + \Delta N_g \qquad (11)$$

Size $D_C$ of a circuit block into which repeaters are yet to be inserted is calculated based on the number $N_g$ of gates and a gate pitch $d_g$ according to the following expression (12).

$$D_C = \sqrt{N_g} d_g \qquad (12)$$

The gate pitch $d_g$ is here calculated based on an average wire length $\overline{R}$, a wire pitch $P_w$, a wire efficiency $e_w$, the number $n_w$ of wiring layers and a mean gate fan out $f_g$ according to the following expression (13).

$$d_g = \frac{f_g \overline{R} p_w}{e_e n_w} \tag{13}$$

The average wire length $\overline{R}$ is expressed as the following equation (14):

$$\overline{R} = \frac{\left(\frac{1}{p} - \frac{\sqrt{N_g}}{p-0.5} - \frac{1}{6\sqrt{N_g}(p+0.5)} + N_g^p\left(\frac{-p-1+4^{p-0.5}}{2(p+0.5)(p-0.5)p(p-1)}\right)\right)}{\left(N_g^{p-0.5}\frac{-2p-1+2^{2p-1}}{2(2p-1)(p-1)(2p-3)} - \frac{1}{6p\sqrt{N_g}} + \frac{1}{p-0.5} - \frac{\sqrt{N_g}}{p-1}\right)} \tag{14}$$

where 'p' denotes a Rent's exponent. Size $D_{crp}$ of a circuit block into which repeaters will have been inserted can be obtained by substituting $N_g'$ into $N_g$ in the expressions (12) and (13).

Next, find the number $N_{rp}$ of repeaters to be inserted in the following manner. First, as calculation expressions for obtaining a total wire length, prepare an expression f(m) of wire distribution and a calculation expression based on wiring parameters of a circuit block and link the two expressions with an equal sign as represented as the following expression (15) to obtain a proportional coefficient 'k' in the expression of wiring distribution.

$$\sum_{m=1}^{m<2\sqrt{N_g}} m \cdot d_g \cdot f(m) = \frac{n_w e_w D_c^2}{p_w} \tag{15}$$

Here, a wire length l is expressed as the following expression (16).

$$l = m \cdot d_g \tag{16}$$

In the expression (16), m denotes a wire length per unit gate pitch. Assuming that the number of wires whose wire length per gate pitch is m is f(m), f(m) will be expressed as the following expressions (17) and (18):

$$1 \leq m < \sqrt{N_g} \tag{17}$$

$$f(m) = k \cdot \Gamma \frac{f_g}{2(f_g+1)}\left(\frac{m^3}{3} - 2\sqrt{N_g}\, m^2 + 2\sqrt{N_g}\, m\right) m^{2p-4}$$

and $$\sqrt{N_g} \leq m < 2\sqrt{N_g} \tag{18}$$

$$f(m) = k \cdot \Gamma \frac{f_g}{6(f_g+1)}\left(2\sqrt{N_g} - m\right)^3 m^{2p-4}$$

provided that $$\Gamma = \frac{2N_g(1 - N_g^{p-1})}{\left(-N_g^p \frac{1+2p-2^{2p-1}}{p(2p-1)(p-1)(2p-3)} - \frac{1}{6p} + \frac{2\sqrt{N_g}}{2p-1} - \frac{N_g}{p-1}\right)} \tag{19}$$

The number $N_{rp}$ of repeaters to be inserted can be obtained by again substituting the proportional coefficient 'k' obtained by the expression (15) into the expressions (17) and (18) and using $n_{rp}$ obtained by the expressions (4) to (7) to make a calculation according to the following expression (20):

$$N_{rp} = \sum_{\substack{L_{rp}\\ d_g < m}}^{m < 2\sqrt{N_g}} n_{rp}\left(md_g \xrightarrow{Substitute} l\right) \cdot f(m) \tag{20}$$

Using thus obtained number $N_{rp}$ of repeaters to be inserted, an increase in the number of gates is calculated from the expressions (10) and (11) to find a size of a chip into which repeaters will have been inserted from the expressions (12) to (14). Hereinafter, a size of a circuit block into which repeaters will have been inserted will be denoted as $D_{crp}$.

Applying a technology parameter, a circuit parameter and a clock parameter of an LSI to be designed obtained by the foregoing analyses enables prediction of various information regarding repeaters before actual detailed design is started such as a size and a wire length of a circuit block which will require repeater insertion, a minimum necessary number of stages of repeaters to be inserted and a minimum necessary ratio of a gate width to a gate length of a repeater, and a size of a circuit block into which repeaters will have been inserted. Also by firstly setting a limit on a circuit scale so as not to require repeater insertion, each circuit block can be arranged without changing a circuit block size.

Next, arrange circuit blocks taking the obtained circuit block size into consideration. In a case where a function of a circuit block is to some extent fixed and it is known to some extent which circuit blocks are to be connected with each other and how many wires are to be used for the connection, arrange the circuit blocks so that a wire which might affect the performance of the entire LSI will be as short as possible. Then, estimate an approximate number of repeaters to be inserted based on an approximate wire length by the above-described manner to arrange the circuit blocks to be spaced from each other by an area necessary for the insertion of repeaters.

In addition, in a case where at such an initial designing stage as the determination of a concept of an LSI, for example, only an approximate number of gates constituting a circuit block is known, a repeater insertion region can be roughly derived in the following manner.

Assumed that an LSI to be designed is constituted by a number i of circuit blocks to which reference numerals 1 to i are assigned, for example, and that the number $N_{g\ i}$ of gates of each circuit block, and a technology parameter, a circuit parameter and a clock parameter of each circuit block are known. Each circuit block size can be calculated by the above-described manner and a size $D_{crp\ i}$ of each circuit block is given by the following expression (21) as a function of the number $N_{g\ i}$ of gates.

$$D_{crp\ i} = D_{crp\ i}(N_{g\ i}) \quad (21)$$

Also, representing the total number Ng of gates of the entire LSI as $N_{g\ total}$, the following expression holds:

$$N_{g\ total} = \sum_{j=1}^{i} N_{gj} \quad (22)$$

Chip size of the entire LSI can be similarly obtained using the value of $N_{g\ total}$ obtained according to the expression (22). Representing the obtained chip size of the entire LSI as $D_{crp\ total}$, the following expression holds:

$$D_{crp\ total} = D_{crp\ total}(N_{g\ total}) \quad (23)$$

Then, an area $S_{int}$ applied for wiring containing repeaters inserted between circuit blocks can be calculated by the following expression (24).

$$S_{int} = D_{crp\ total}^2 - \sum_{j=1}^{i} D_{crp\ j}^2 \quad (24)$$

With thus calculated $S_{int}$ as a criterion, circuit blocks should be spaced from each other.

FIG. 1 is a block diagram showing structure of an LSI designing system realizing the above-described semiconductor integrated circuit (LSI) design. With reference to FIG. 1, an LSI designing system of the present embodiment includes an input unit 110 for receiving input of the number of circuit blocks constituting an LSI to be designed and various parameters, a repeater information calculation unit 120 for calculating various information regarding insertion of repeaters based on applied data, a circuit block arrangement unit 130 for arranging circuit blocks, a delay calculation unit 140 for obtaining a wire delay of a wire between arranged circuit blocks, a cycle time calculation unit 150 for calculating a cycle time of the entire LSI, and a detailed wiring unit 160 for conducting detailed wiring in each circuit block. In FIG. 1, illustration is made only of a characteristic part of the structure of the present embodiment and that of the remaining common part is omitted.

The LSI designing system of the present embodiment is implemented, for example, by a workstation, a personal computer or other computer system. Of the above-described structure, therefore, the input unit 110 is implemented by an input device such as a keyboard or various interface means, and the repeater information calculation unit 120, the circuit block arrangement unit 130, the delay calculation unit 140, the cycle time calculation unit 150 and the detailed wiring unit 160 are implemented by program-controlled CPU and internal memory such as an RAM. The computer program which controls the CPU is stored, for provision, in a common storage medium such as a magnetic disk, an optical disk or a semiconductor memory, and loaded into a data processing device of the computer system to execute a function of each component.

Figure 2:
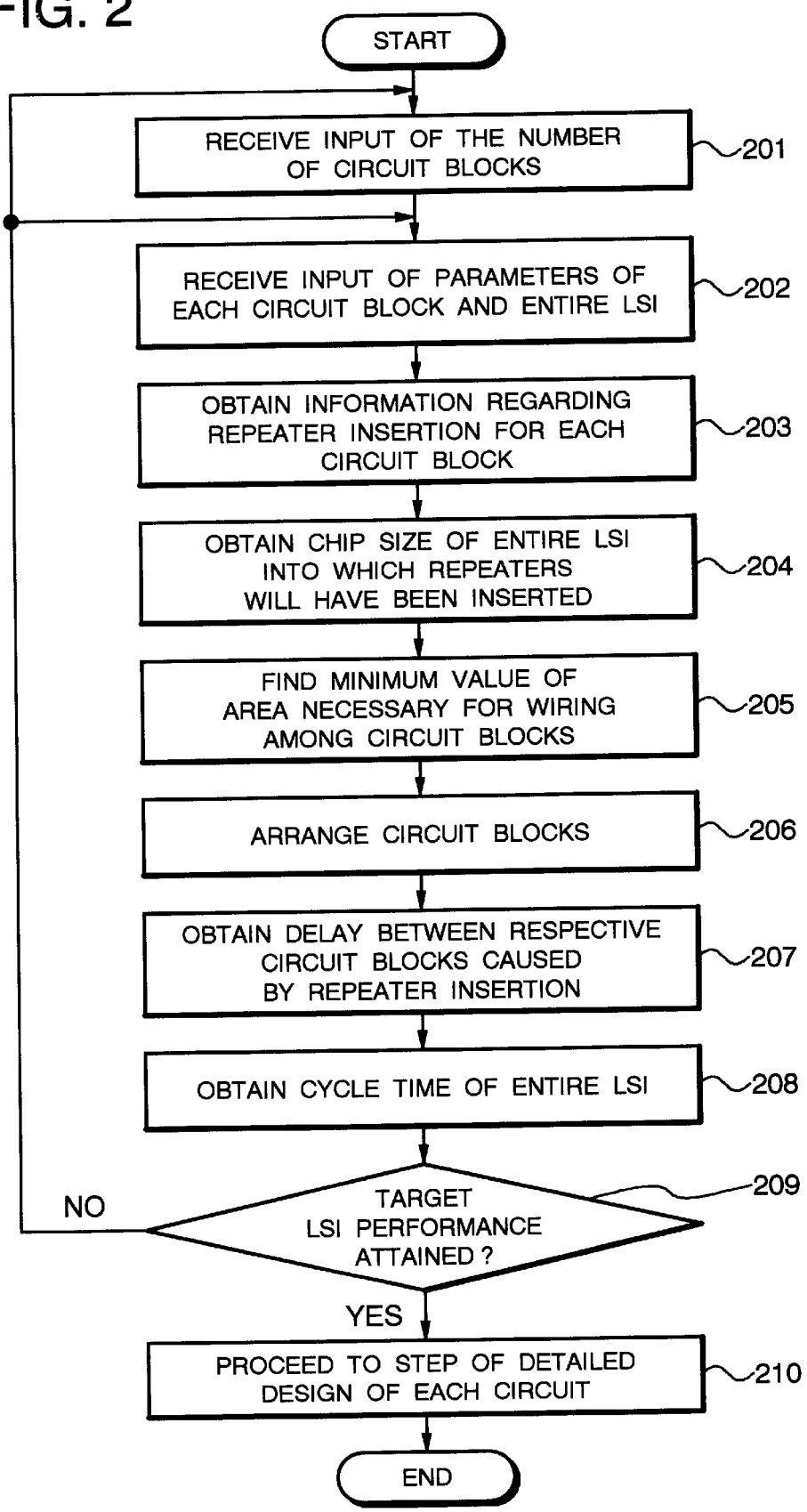
FIG. 2 is a flow chart showing operation of the present embodiment.

Description will be next made of operation of the present embodiment with reference to the flow chart of FIG. 2. With reference to FIG. 2, first determine how many circuit blocks are to constitute an LSI to be designed based on input through the input unit 110 (Step 201). Further through the input unit 110, receive input of the number of gates, a technology parameter, a circuit parameter and a clock parameter of each circuit block (Step 202). Next, using the above-described input parameters, the repeater information calculation unit 120 obtains, out of the above-described respective circuit blocks, a size and a wire length of a circuit block which requires repeater insertion, an optimum number of stages of repeaters to be inserted, and a ratio of a gate width to a gate length of a repeater and the number of repeaters to be inserted and further obtains a size of a circuit block into which the repeaters will have been inserted (Step 203). Next, using the number of gates of the entire LSI applied at Step 202, the unit 120 obtains a chip size of the entire LSI into which repeaters will have been inserted (Step 204). Next, the circuit block arrangement unit 130 finds a minimum value of an area of a region necessary for wiring between circuit blocks (Step 205) to arrange circuit blocks with a space from each other equivalent to the obtained area of a region (Step 206). Next, the delay calculation unit 140 calculates a wire delay in wiring between circuit blocks (Step 207) and then the cycle time calculation unit 150 compares the obtained wire delay and cycle times of the respective circuit blocks obtained in advance and regards a maximum value among them as a cycle time of the entire LSI (Step 208). When the obtained value of a cycle time of the entire LSI satisfies target LSI performance, the routine proceeds to processing of detailed design of each circuit block by the detailed wiring unit 160 (Steps 209 and 210). On the other hand, when the obtained value of a cycle time of the entire LSI fails to satisfy the target LSI performance, the processing will be executed over again starting with the application of circuit block parameters (Step 202) and when satisfied LSI performance can not be yet attained, the processing will be executed over again starting with the determination of the number of circuit blocks (Step 209). The foregoing operation will be repeated until desired LSI performance is attained.

Figure 3:
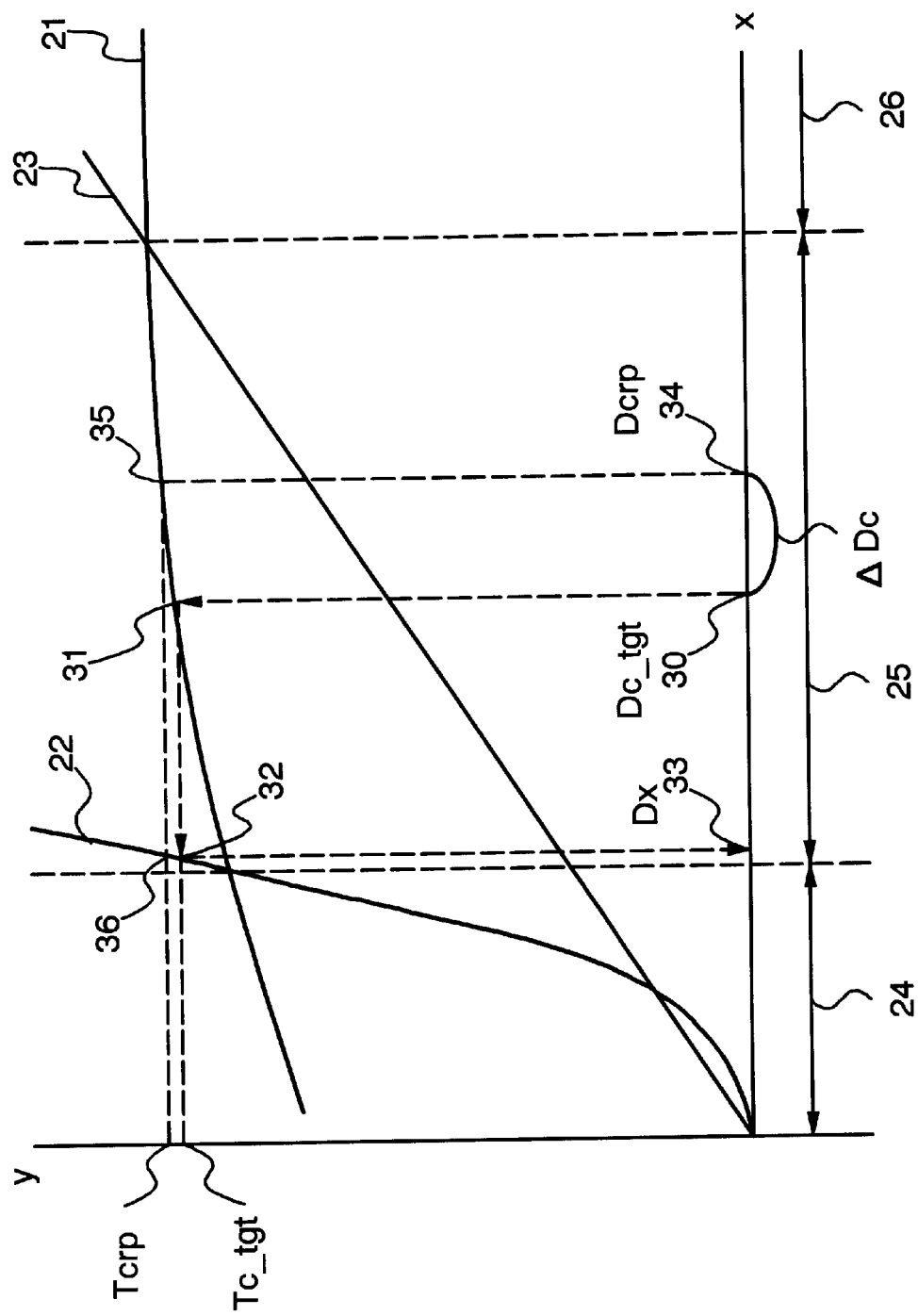
FIG. 3 is a diagram for use in explaining one example of a specific method of calculating a size of a circuit block into which repeaters will have been inserted according to the present embodiment.
Figure 4:
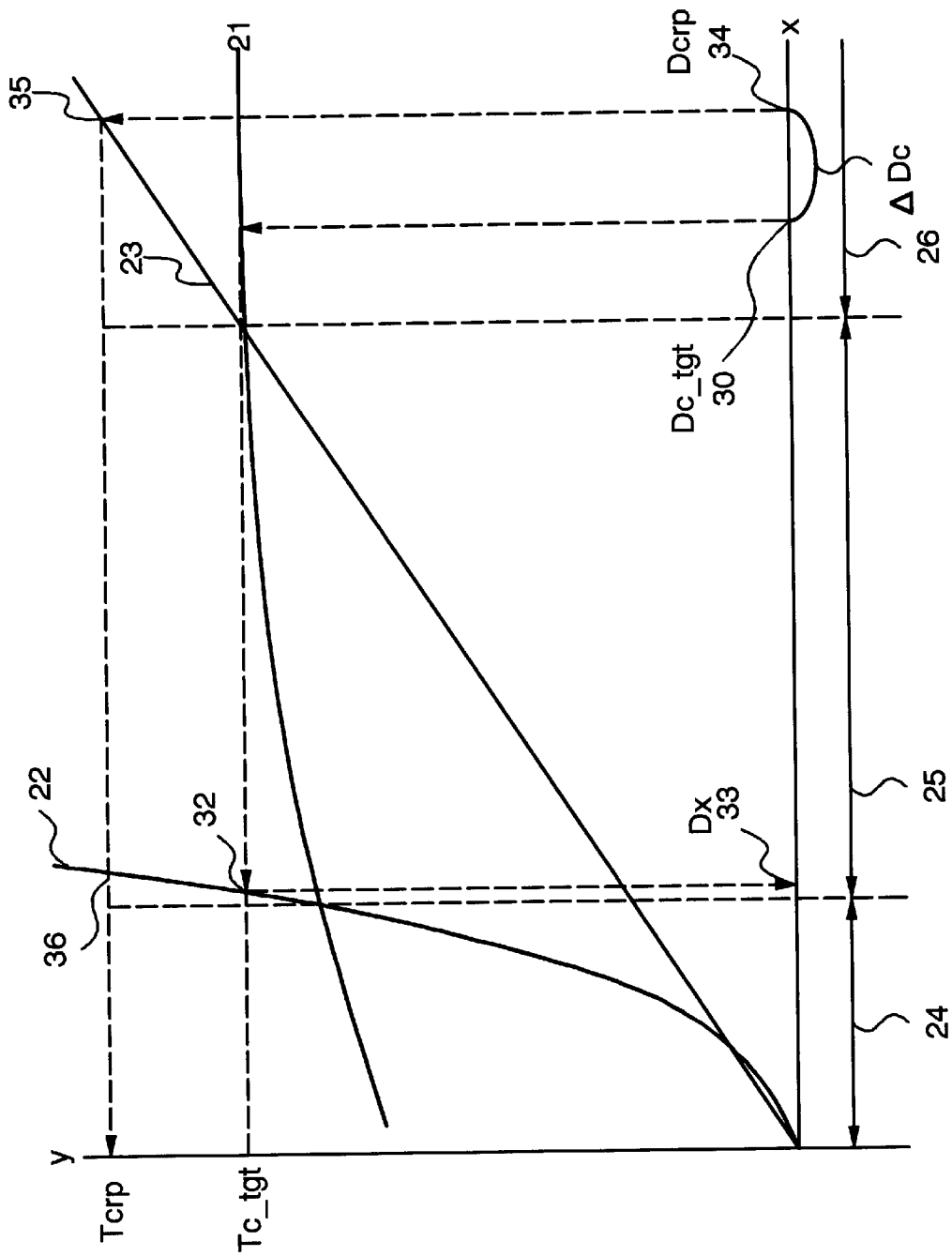
FIG. 4 is a diagram for use in explaining another example of a specific method of calculating a size of a circuit block into which repeaters will have been inserted according to the present embodiment.

With reference to FIGS. 3 and 4, description will be made of a specific method of calculating a size of a circuit block into which repeaters will have been inserted. FIGS. 3 and 4 are graphs into which a cycle time, a wire delay and a wire delay generated when repeaters are used (hereinafter referred to as a repeater delay) of a circuit block are plotted. The x-axis denotes a block size, while the y-axis denotes a cycle time or a delay. In each diagram, a curve 21 represents a function of a cycle time with respect to a block size, a curve 22 represents a function of a wire delay with respect to a block size and a curve 23 represents a function of a repeater delay with respect to a block size. Based on the positions of the points of intersection of the function 21 and the function 22 and intersection of the function 22 and the function 23, the circuit block size is divided into three regions, regions 24, 25 and 26. In the following, description will made of a method of calculating a block size of a circuit block corresponding to each region.

In the region 24, since a cycle time of a circuit block is longer than a wire delay, insertion of a repeater is unnecessary. More specifically, setting the number $N_{g\ tgt}$ of gates of a circuit block to be small so that the circuit block size is smaller than a circuit block size Dx which requires repeater insertion eliminates the need of repeater insertion.

Next, description will be made of a method of calculating block size corresponding to the region 25. First calculate a circuit block size $D_{C\ tgt}$ of a circuit block into which repeaters are yet to be inserted from the target number $N_{g\_tgt}$ of gates of a circuit block to plot the value of 30 of the x-axis. Based on the circuit block size $D_{C\_tgt}$, find a target cycle time $T_{C\_tgt}$ from the position of a point of intersection 31 between a line of "x=$D_{C\_tgt}$" and the function 21 of a cycle time. Then, from the position of a point of intersection 32 between a line of "y=$T_{C\_tgt}$" and the function 22 of a wire delay, calculate a size Dx (33) of a circuit block which requires repeater insertion and from the circuit block size Dx, calculate a wire length $L_{rp}$ requiring repeater insertion. Further from the calculated wire length $L_{rp}$, calculate the number of repeaters to be inserted. Based on the foregoing respective values, a block size $D_{crp}$ (34) of a circuit block into which repeaters will have been inserted can be estimated.

Increase in circuit block size after the repeater insertion leads to increase in an average wire length, whereby a cycle time of the circuit block will be slightly increased. This cycle time $T_{crp}$ of a circuit block into which repeaters will have been inserted is obtained as a value of the y-axis corresponding to a point of intersection 35 of the line of "x=$D_{crp}$" and the function 21. This increase in a cycle time of the circuit block will make a wire length requiring repeater insertion longer (point of intersection 36). Then, using the newly obtained wire length requiring repeater insertion, calculating a size of a circuit block into which repeaters will have been inserted will result in having a circuit block size smaller than that estimated last time. A circuit cycle time is then calculated by using this circuit block size, and so forth. Repetition of such operation will have a circuit block size and a cycle time to each converge on one value.

Therefore, when highly precise estimation results should be obtained of a circuit block size or a cycle time of a circuit block into which repeaters will have been inserted, the above-described operation are to be repeated until these values converge or fall within a range of errors. It is also possible to use $D_{crp}$ and $T_{crp}$ derived as one of information for design from the first calculation as upper bounds.

Description will be next made of a method of calculating a block size corresponding to the region 26 with reference to FIG. 4. The calculation for the region 26 can be similarly conducted to the above-described calculation method for the region 25. First, calculate a size $D_{C\_tgt}$ of a circuit block into which repeaters are yet to be inserted from a target number $N_{g\_tgt}$ of gates of a circuit block, obtain a target cycle time $T_{C\_tgt}$ from the obtained circuit block size $D_{C\_tgt}$ and calculate a wire length $L_{rp}$ which requires repeater insertion from a size Dx of a circuit block which requires repeater insertion, which wire length $L_{rp}$ enables estimation of a block size $D_{crp}$ of a circuit block into which repeaters will have been inserted.

Next, a cycle time of a circuit block into which repeaters will have been inserted is calculated as a value of the y-axis corresponding to a point of intersection 37 between the line of "x=$D_{crp}$" and the function 23 of a repeater delay. This is because in the region 26, a repeater delay exceeds a cycle time of the circuit block to be dominant over the performance of the circuit block. In the processing from this step on, similarly to the processing for the region 25, calculation of a wire length for the insertion of repeaters and calculation of a cycle time of a circuit block may be repeated to obtain a value of higher precision or the first calculation value may be used as an upper bound.

Next, description will be made of an example of design for an LSI in a case where the LSI is composed of four circuit blocks with reference to FIG. 5. Before insertion of repeaters, a circuit block 40 has a size indicated as a circuit block size 42, which is increased to a size indicated as a circuit block size 43 as a result of the insertion of repeaters. Using an expanded circuit block 41, circuit blocks are laid out. Circuit blocks may be also laid out after calculating, as shown in a circuit block 51, a circuit block size 54 of a circuit into which repeaters will have been inserted from a circuit block size 53 of a circuit block 50 into which repeaters are yet to be inserted, and replacing the circuit block 51 with a rectangular circuit block 52 having the same area as that of the circuit block size 54 and a different ratio of a horizontal side to a vertical side. In this case, the following expression (25) holds between a calculated value 54 ($D_{crp}$) of the size of a circuit block into which repeaters will have been inserted and a horizontal side 56 ($D_{crp\_x}$) of the rectangle and a vertical side 55 ($D_{crp\_y}$) of the rectangle.

$$D_{crp}^2 = D_{crp\_x} \cdot D_{crp\_y} \tag{25}$$

In such a case as a circuit block 70 whose number of gates is small and whose block size 71 is smaller than the size of a circuit block requiring repeater insertion, repeater insertion will cause no increase in chip size and therefore a circuit block size predicted from the number of gates can be applied to layout without a change. Making the most of this to design an LSI at the stage of first division into circuit blocks so that any of circuit blocks has a size smaller than the size of the circuit block which requires repeater insertion makes insertion of repeaters necessary only between circuit blocks, resulting in drastically reducing the number of steps of detailed design.

After the estimation of a size of each circuit block into which repeaters will have been inserted, each circuit block is arranged with a space of a region 61 for wiring between circuit blocks at the time of layout work. The region 61 contains a wire 63 with repeaters inserted therein and a wire 64 which requires no insertion of repeaters. Since a total area of the region 61 can be estimated in advance, a distance of a space between circuit blocks can be estimated by distributing the area to each circuit block. In addition, prior to detail design of wires among blocks, such a criterion for determination can be set as to determine that circuit blocks are tightly arranged when a calculation result of an area usable for wiring among circuit blocks obtained after rough layout of circuit blocks is smaller than an initial estimate, and conversely, when the calculation result is larger than the initial estimate, determine that the circuit blocks are arranged with a margin.

Figure 5:
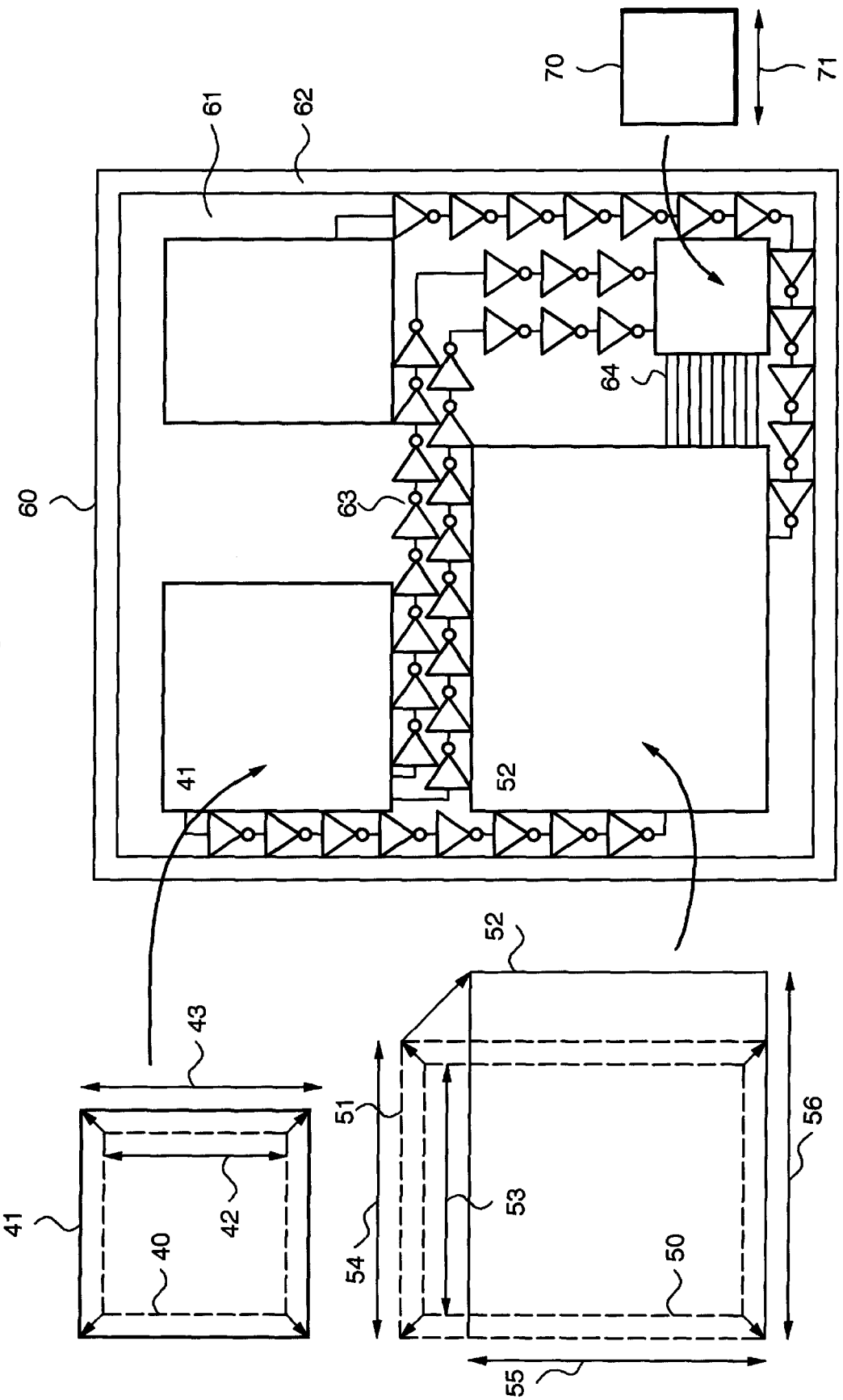
FIG. 5 is a diagram showing one example of a circuit block layout method according to the present embodiment.

In addition, a region 62 for a pad unit of a chip may be provided outside a wiring region among circuit blocks as shown in FIG. 5.

As described in the foregoing, the semiconductor integrated circuit (LSI) designing system of the present invention and the designing method thereof enable prediction of a size and a wire length of a circuit block which requires repeater insertion, a minimum necessary number of stages of repeater insertion and a minimum necessary ratio of a gate width to a gate length of a repeater, and a size of a circuit block into which repeaters will have been inserted before starting actual detailed design, thereby obtaining guidelines for inserting repeaters at an initial stage of the designing to not only speed up the subsequent designing processing but also avoid drastic design change to be necessitated by the insertion of repeaters after detailed design.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A semiconductor integrated circuit designing system which designs an LSI by arranging circuit blocks on an LSI chip and conducting wiring within the circuit blocks and between the circuit blocks, comprising:

input means for receiving input of a technology parameter, a circuit parameter and a clock parameter regarding said circuit blocks constituting the LSI;

repeater information calculation means for obtaining information regarding insertion of repeaters by using said parameters applied through said input means;

circuit block arrangement means for arranging said circuit blocks based on said information regarding insertion of repeaters obtained by said repeater information calculation means;

delay calculation means for calculating a wire delay of wiring between said circuit blocks arranged by said circuit block arrangement means;

cycle time calculation means for obtaining a cycle time of the entire LSI based on a delay value calculated by said delay calculation means; and detailed wiring means for conducting detailed wiring within said circuit blocks on said LSI whose arrangement on a circuit block basis and wiring processing have been completed.

2. The semiconductor integrated circuit designing system as set forth in claim 1, wherein said repeater information calculation means predicts, as information regarding insertion of repeaters, at least a size and a wire length of a circuit block which will require repeater insertion.

3. The semiconductor integrated circuit designing system as set forth in claim 1, wherein said repeater information calculation means predicts, as information regarding insertion of repeaters, at least a size and a wire length of a circuit block which will require repeater insertion, and a minimum necessary number of stages of repeaters inserted and a minimum necessary ratio of a gate width to a gate length of a repeater with respect to a wire which requires repeater insertion.

4. The semiconductor integrated circuit designing system as set forth in claim 1, wherein said repeater information calculation means predicts, as information regarding insertion of repeaters, at least a block size of said circuit block where repeaters having a minimum necessary number of insertion stages and a minimum necessary ratio of a gate width to a gate length would be inserted into every wire which will require repeater insertion by using a wire distribution predicted from said parameters.

5. The semiconductor integrated circuit designing system as set forth in claim 1, wherein said repeater information calculation means predicts, as information regarding insertion of repeaters, at least a size and a wire length of a circuit block which will require repeater insertion, a minimum necessary number of stages of repeaters inserted and a minimum necessary ratio of a gate width to a gate length of a repeater with respect to a wire which requires repeater insertion, and a block size of said circuit block where repeaters having a minimum necessary number of insertion stages and a minimum necessary ratio of a gate width to a gate length would be inserted into every wire which will require repeater insertion by using a wire distribution predicted from said parameters.

6. The semiconductor integrated circuit designing system as set forth in claim 1, wherein said repeater information calculation means predicts, as information regarding insertion of repeaters, at least a size and a wire length of a circuit block which will require repeater insertion, and said circuit block arrangement means limits a size of each circuit block to a size which will require no repeater insertion to arrange the circuit block.

7. The semiconductor integrated circuit designing system as set forth in claim 1, wherein said repeater information calculation means predicts, as information regarding insertion of repeaters, at least a size and a wire length of a circuit block which will require repeater insertion, and a minimum necessary number of stages of repeaters inserted and a minimum necessary ratio of a gate width to a gate length of a repeater with respect to a wire which requires repeater insertion, and said circuit block arrangement means estimates an area necessary for the arrangement of said circuit blocks and wiring between said circuit blocks and prepares a region for wiring among said circuit blocks according to an obtained value to arrange said circuit blocks.

8. A semiconductor integrated circuit designing method of designing an LSI by arranging circuit blocks on an LSI chip and conducting wiring within the circuit blocks and between the circuit blocks, comprising the steps of:

receiving input of a technology parameter, a circuit parameter and a clock parameter regarding said circuit blocks constituting the LSI;

obtaining information regarding insertion of repeaters by using said parameters applied;

arranging said circuit blocks based on said information regarding insertion of repeaters;

calculating a wire delay of wiring between said circuit blocks arranged;

obtaining a cycle time of the entire LSI based on a calculated delay value; and conducting detailed wiring within said circuit blocks on said LSI whose arrangement on a circuit block basis and wiring processing have been completed.

9. The semiconductor integrated circuit designing method as set forth in claim 8, wherein at said repeater information calculation step, at least a size and a wire length of a circuit block which will require repeater insertion are predicted as information regarding insertion of repeaters, and at said circuit block arrangement step, a size of each circuit block is limited to a size which will require no repeater insertion to arrange the circuit block.

10. The semiconductor integrated circuit designing method as set forth in claim 8, wherein at said repeater information calculation step, predicted as information regarding insertion of repeaters are at least a size and a wire length of a circuit block which will require repeater insertion, and a minimum necessary number of stages of repeaters inserted and a minimum necessary ratio of a gate width to a gate length of a repeater with respect to a wire which requires repeater insertion, and at said circuit block arrangement step, an area necessary for the arrangement of said circuit blocks and wiring among said circuit blocks is estimated and a region for wiring among said circuit blocks is prepared according to the obtained value to arrange said circuit blocks.

11. A computer readable memory storing a computer program for controlling a semiconductor integrated circuit designing system which designs an LSI by arranging circuit blocks on an LSI chip and conducting wiring within the circuit blocks and between the circuit blocks, said computer program comprising the steps of:

receiving input of a technology parameter, a circuit parameter and a clock parameter regarding said circuit blocks constituting the LSI;

obtaining information regarding insertion of repeaters by using said parameters applied;

arranging said circuit blocks based on said information regarding insertion of repeaters;

calculating a wire delay of wiring between said circuit blocks arranged;

obtaining a cycle time of the entire LSI based on a calculated delay value; and conducting detailed wiring within said circuit blocks on said LSI whose arrangement on a circuit block basis and wiring processing have been completed.

12. The computer readable memory as set forth in claim 11, wherein at said repeater information calculation step of said computer program, at least a size and a wire length of a circuit block which will require repeater insertion are predicted as information regarding insertion of repeaters, and at said circuit block arrangement step, a size of each circuit block is limited to a size which will require no repeater insertion to arrange the circuit block.

13. The computer readable memory as set forth in claim 11, wherein at said repeater information calculation step of said computer program, predicted as information regarding insertion of repeaters are at least a size and a wire length of a circuit block which will require repeater insertion, and a minimum necessary number of stages of repeaters inserted and a minimum necessary ratio of a gate width to a gate length of a repeater with respect to a wire which requires repeater insertion, and at said circuit block arrangement step, an area necessary for the arrangement of said circuit blocks and wiring among said circuit blocks is estimated and a region for wiring among said circuit blocks is prepared according to the obtained value to arrange said circuit blocks.

* * * * *

UNITED STATES PATENT AND TRADEMARK OFFICE
CERTIFICATE OF CORRECTION

PATENT NO. : 6,198,978 B1  Page 1 of 1
DATED : March 06, 2001
INVENTOR(S) : Shuji Takahashi It is certified that error appears in the above-identified patent and that said Letters Patent is hereby corrected as shown below:

<u>Column 6,</u>
Line 32, after "$gl^2$" delete -- ttm --

Signed and Sealed this

Eighteenth Day of December, 2001

Attest:

*Attesting Officer*

JAMES E. ROGAN
*Director of the United States Patent and Trademark Office*